United States Patent
Lee et al.

(10) Patent No.: US 7,336,230 B2
(45) Date of Patent: Feb. 26, 2008

(54) METHOD FOR MEASURING ELECTROMAGNETIC RADIATION PATTERN AND GAIN OF RADIATOR USING TERM WAVEGUIDE

(75) Inventors: Ae-Kyoung Lee, Daejon (KR); Hyung-Do Choi, Seoul (KR); Jeong-Ki Pack, Daejon (KR)

(73) Assignee: Electronics and Telecommunications Research Institute, Daejon (KR)

( * ) Notice: Subject to any disclaimer, the term of this patent is extended or adjusted under 35 U.S.C. 154(b) by 77 days.

(21) Appl. No.: 10/580,462

(22) PCT Filed: Jun. 22, 2004

(86) PCT No.: PCT/KR2004/001509

§ 371 (c)(1),
(2), (4) Date: May 25, 2006

(87) PCT Pub. No.: WO2005/052608

PCT Pub. Date: Jun. 9, 2005

(65) Prior Publication Data

US 2007/0126427 A1    Jun. 7, 2007

(30) Foreign Application Priority Data

Nov. 25, 2003   (KR) .................. 10-2003-0084207

(51) Int. Cl.
*G01R 29/10*    (2006.01)

(52) U.S. Cl. .................. 343/703; 324/627; 324/628; 324/632

(58) Field of Classification Search ................ 343/703; 324/627, 628, 632
See application file for complete search history.

(56) References Cited

U.S. PATENT DOCUMENTS

| | | | |
|---|---|---|---|
| 4,837,581 A | * | 6/1989 | Hansen et al. .............. 343/703 |
| 5,237,283 A | | 8/1993 | Carbonini |
| 5,404,098 A | | 4/1995 | Osburn |
| 5,844,413 A | * | 12/1998 | Hansen et al. .............. 324/627 |
| 6,181,285 B1 | | 1/2001 | Sullivan et al. |

FOREIGN PATENT DOCUMENTS

JP    2003-057281    2/2003

(Continued)

OTHER PUBLICATIONS

P. Wilson; "On Correlating TEM Cell and OATS Emission Measurements"; IEEE Transactions on Electromagnetic Compatability; vol. 37; No. 1; Feb. 1995; pp. 1-16.

(Continued)

*Primary Examiner*—Hoang V. Nguyen
(74) *Attorney, Agent, or Firm*—Lowe Hauptman Ham & Berner LLP

(57) ABSTRACT

A method for measuring electromagnetic radiation pattern and gain of radiator using TEM waveguide is disclosed. The method includes the steps of: a) measuring powers of output port of a transverse electric and magnetic (TEM) waveguide by changing arrangements of the radiator located within the TEM waveguide; and b) estimating a radiation power density of the radiator in free space, wherein the radiator is modeled as a dipole moment based on the powers of the output port of the TEM waveguide.

9 Claims, 12 Drawing Sheets

FOREIGN PATENT DOCUMENTS

KR 1020030002957 1/2003
KR 1020030056277 7/2003

OTHER PUBLICATIONS

"American National Standard for Methods of Measurement of Radio-Noise emissions from Low-Voltage Electrical and Electronic Equipment in the Range of 9kHz to 40GHz"; ANSI C63.4-2001; pp. 114-123.

A.K. Lee; "A Simple Method for Determination of Effective Radiated Power From a Handset"; BEMS Twenty-Fifth Annual Meeting held on Jun. 22-27, 2003; pp. 1-15.

International Search Report dated Sep. 30, 2004 for PCT/KR2004/001509.

* cited by examiner

ELECTRIC DIPOLE MOMENT $P = P_x e^{j\varphi px} + P_y e^{j\varphi py} + P_z e^{j\varphi pz}$
MAGNETIC DIPOLE MOMENT $M = M_x e^{j\varphi mx} + M_y e^{j\varphi my} + M_z e^{j\varphi mz}$

ARRANGEMENT 1 (COUNTERCLOCKWISE 0°)

ARRANGEMENT 2 (COUNTERCLOCKWISE 45°)

ARRANGEMENT 3 (COUNTERCLOCKWISE 90°)

ARRANGEMENT 4 (COUNTERCLOCKWISE 180°)

ARRANGEMENT 5 (COUNTERCLOCKWISE 270°)

(XX', YY', ZZ') ROTATE ON Y-AXIS

ARRANGEMENT 6 (COUNTERCLOCKWISE 0°)

ARRANGEMENT 7 (COUNTERCLOCKWISE 45°)

ARRANGEMENT 8 (COUNTERCLOCKWISE 90°)

ARRANGEMENT 9 (COUNTERCLOCKWISE 180°)

ARRANGEMENT 10 (COUNTERCLOCKWISE 270°)

(XY', YZ', ZX') ROTATE ON Y-AXIS

ARRANGEMENT 11 (COUNTERCLOCKWISE 0°)

ARRANGEMENT 12 (COUNTERCLOCKWISE 45°)

ARRANGEMENT 13 (COUNTERCLOCKWISE 90°)

ARRANGEMENT 14 (COUNTERCLOCKWISE 180°)

ARRANGEMENT 15 (COUNTERCLOCKWISE 270°)

(XZ', YX', ZY') ROTATE ON Y-AXIS

ARRANGEMENT 16 (COUNTERCLOCKWISE 45°)

(XX', YY', ZZ') ROTATE ON X-AXIS

ARRANGEMENT 17 (COUNTERCLOCKWISE 45°)

(XY', YZ', ZX') ROTATE ON X-AXIS

ARRANGEMENT 18 (COUNTERCLOCKWISE 45°)

(XZ', YX', ZY') ROTATE ON X-AXIS

US 7,336,230 B2

METHOD FOR MEASURING ELECTROMAGNETIC RADIATION PATTERN AND GAIN OF RADIATOR USING TERM WAVEGUIDE

CROSS REFERENCE TO RELATED APPLICATION

This application is the National Phase application of International Application No. PCT/KR2004/001509, filed Jun. 22, 2004, which designates the United States and was published in English. This application, in its entirety, is incorporated herein by reference.

TECHNICAL FIELD

The present invention relates to a method for measuring an electromagnetic radiation pattern and gain of a radiator; and, more particularly, to a method for measuring the electromagnetic radiation pattern and gain of a radiator by electrically modeling the radiator based on powers of output ports of a traverse electric and magnetic (TEM) waveguide wherein the powers are measured for eighteen (18) arrangements of the radiator after locating the radiator within the TEM waveguide.

BACKGROUND ART

FIGS. 1 and 2 are diagrams illustrating a conventional radiation power measurement method wherein an electromagnetic signal is directly received from an antenna in an open area test site (OATS) or an anechoic chamber.

As shown, a maximum radiation power or an effective radiation power (ERP) is measured in a standard test site, e.g., an open area test sites (OATS) or an anechoic chamber. The conventional radiation power measurement method will be described.

An equipment under test (EUT) 101 is located on a turntable of the standard test site (step 1), a transmission antenna 102 is located to be opposite to a test antenna 103, and then a signal having the highest power is written by moving the test antenna up and down ranging a few meters, e.g., in case of ANSI std., 1 m~6 m (step 2). By rotating the turntable 100 by a predetermined angle, e.g., ANSI std., 45°, seven additional values are written by repeating the step 2 (Step 3). Then, the transmitter under test 101 is replaced with a half-wave vertical antenna 112 (step 4). The half-wave vertical antenna 112 should be located so that the center of the antenna is identical to that of the EUT, and the antenna is connected to a radio frequency (RF) signal generator 111 having known output values. Path losses are written and an effective radiation power (ERP) is computed based on the path losses.

The conventional radiation power measurement method is based on an EelectroMagnetic Interference (EMI) measurement method, and measures/estimates the maximum radiation power or the ERP by receiving an electromagnetic signal on the antenna in the OATS or anechoic chamber.

However, the conventional radiation power measurement method performed in the OATS or the anechoic chamber have drawbacks that it takes much time to measure radiation from a test object because of direct measurement by antenna, a maintenance fee for the standard test site costs high, and there are a lot of measurement errors because of environmental uncertainty.

Also, in estimation of the ERP/a total radiation power (TRP), it is preferred that a radiation field is estimated on spherical surface in free space. However, the conventional measuring method uses a cylindrical scanning method, and therefore, there is a drawback that a receiving field can be devaluated.

FIG. 3 is a diagram showing a conventional radiation power measurement method in a semi-anechoic chamber, and FIG. 4 is a diagram showing a conventional radiation power measurement method in an anechoic chamber.

Referring to FIG. 3, the conventional radiation power measurement method in the semi-anechoic chamber has the same drawbacks as the conventional radiation power measurement method described above with reference to FIGS. 1 and 2. The conventional measuring method takes a long time to measure the power and a high maintenance fee. Also, since there is reflection due to the ground plane, a measurement error is large. The conventional measuring method uses a sphere scan, and the radiation field can be devaluated. In the conventional measuring method in the anechoic chamber described with reference to FIG. 4, the measurement error is small, however, it take a long time to measure the power and a high maintenance fee.

SUMMARY OF THE INVENTION

It is, therefore, an object of the present invention to provide a method for measuring the electromagnetic radiation pattern and gain of a radiator by electrically modeling the radiator based on powers of output ports of a traverse electric and magnetic (TEM) waveguide wherein the powers are measured for eighteen (18) arrangements of the radiator after locating the radiator within the TEM waveguide.

In accordance with an aspect of the present invention, there is provided a method for measuring a radiation pattern and a gain of a radiator, including the steps of: a) measuring powers of output port of a transverse electric and magnetic (TEM) waveguide by changing arrangements of the radiator located within the TEM waveguide; and b) estimating a radiation power density of the radiator in free space, wherein the radiator is modeled as a dipole moment based on the powers of the output port of the TEM waveguide.

The method as recited in claim 1, further includes the steps of: c) measuring a power $P_0$ received by an antenna of the radiator based on a conducted power accepted by the radiator and a reflecting coefficient of an antenna of the radiator, and obtaining a maximum radiation power density $P_D$ of a half-wave dipole antenna due to the power $P_0$ at a predetermined distance; d) obtaining the maximum radiation power density $P_{max}$ among the estimated radiation power densities; e) obtaining a radiation gain of the radiator based on the maximum radiation power density $P_{max}$ obtained in the step d) and the maximum radiation power density $P_D$ obtained in the step d); and f) obtaining an effective radiation power based on the maximum radiation power density $P_{max}$, wherein the maximum radiation power density $P_D$ of a half-wave dipole antenna due to the power $P_0$ at a predetermined distance is obtained by an equation as:

$$P_D = \frac{P_0 \cdot \left( \text{gain of half} - \text{wave dipole antenna measured in } TEM \text{ waveguide} \right)}{4\pi R^2}.$$

BRIEF DESCRIPTION OF THE DRAWINGS

The above and other objects and features of the present invention will become apparent from the following description of the preferred embodiments given in conjunction with the accompanying drawings, in which:

FIGS. 12 to 18 are diagrams illustrating a method for measuring powers $P_1 \sim P_{18}$ of the output port of the TEM waveguide for eighteen (18) arrangements of EUT in accordance with the present invention.

BEST MODE FOR CARRYING OUT THE INVENTION

Other objects and aspects of the invention will become apparent from the following description of the embodiments with reference to the accompanying drawings, which is set forth hereinafter.

Figure 1:
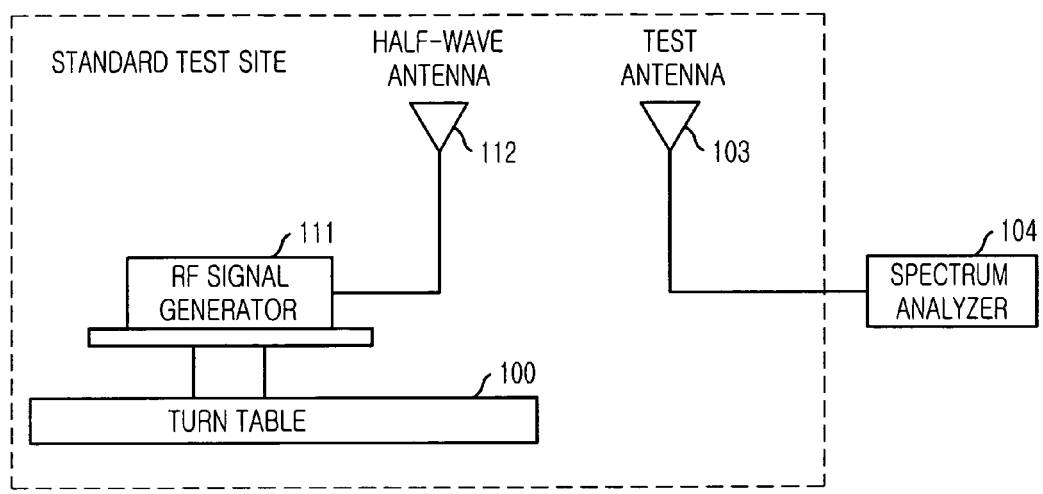
FIGS. 1 and 2 are diagrams illustrating a conventional radiation power measurement method wherein an electromagnetic signal is directly received from an antenna in an open area test site (OATS) or an anechoic chamber.
Figure 2:
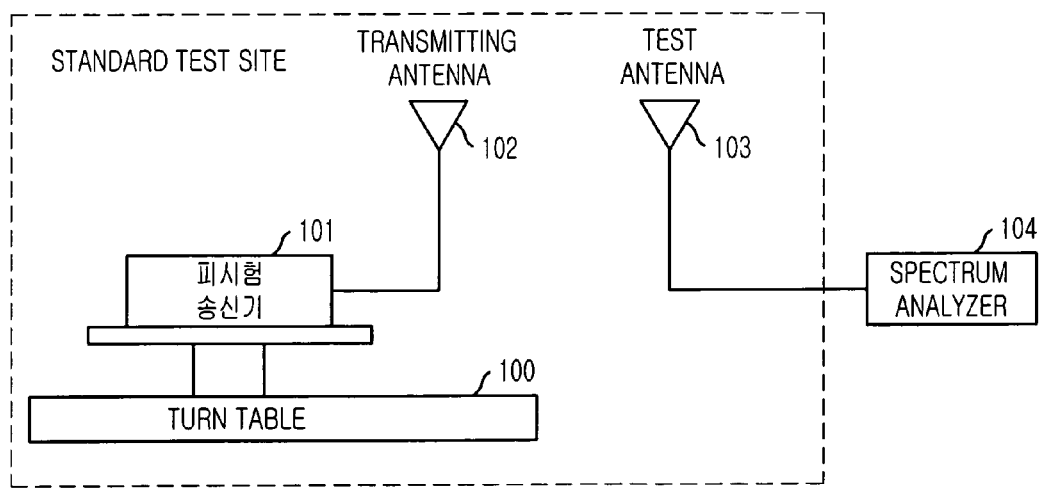
Figure 3:
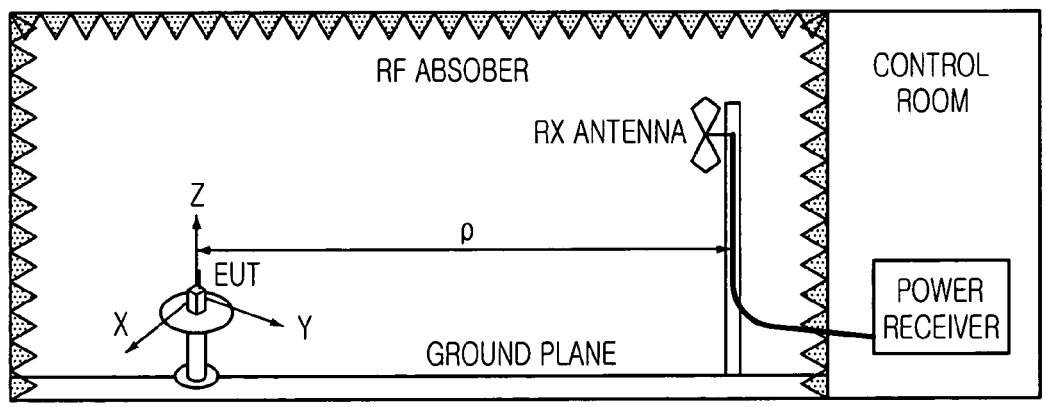
FIG. 3 is a diagram showing a conventional radiation power measurement method in a semi-anechoic chamber.
Figure 4:
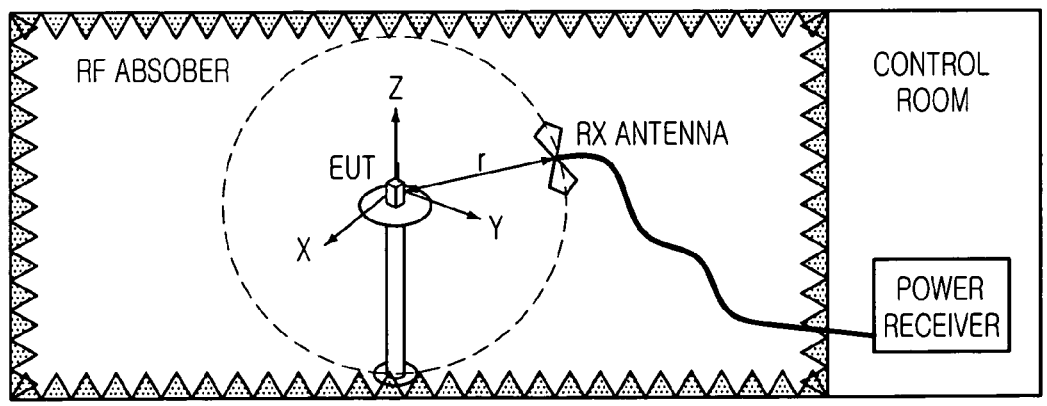
FIG. 4 is a diagram showing a conventional radiation power measurement method in an anechoic chamber.
Figure 5:
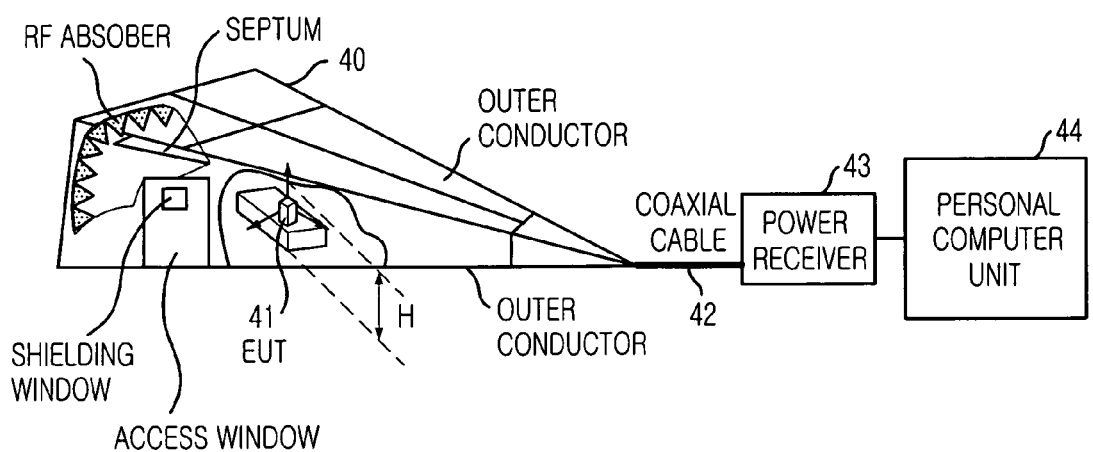
FIG. 5 is a diagram illustrating a radiation pattern and gain measurement system using TEM waveguide to which the present invention is applied.

FIG. 5 is a diagram illustrating a radiation pattern and gain measurement system using TEM waveguide to which the present invention is applied.

In order to overcome problem of the conventional measuring method, for the EMI measurement, there are many tries that the measurement on the ground is replaced with measurement in transverse electric and magnetic (TEM) waveguide. Some of the measurements in TEM waveguide are standardized by international special committee on radio interference (CISPR).

The TEM waveguide means a device transferring the TEM mode, e.g., TEM cell, Gigahertz Transverse Electro-Magnetic cell (GTEM cell), and has at least one port.

In the present invention, since it is used a power of one port of the TEM waveguide, and a various kinds of TEM waveguides can be used.

As shown, the TEM waveguide has a rectangular shape enlarged from a coaxial cable so that characteristic impedance is kept. The TEM waveguide is a device transferring a TEM mode, the EUT is located within the TEM waveguide, a power of an output port of the TEM waveguide is measured and electromagnetic modeling of the EUT is performed based on the output power.

The EUT is an electromagnetic element to be measured for a radiation field, for an accurate measurement, the size of the EUT is proper to be within uniform field of the TEM waveguide.

For accurate modeling of the EUT within the TEM waveguide, the EUT should be located in various directions, such that the EUT is electromagnetically modeled based on the power of output port of the TEM waveguide for each direction.

In general, the EUT is assumed to be a pair of an electronic dipole moment and a magnetic dipole moment. A phase difference between the moments, of which vectors are orthogonal to each other, is considered or disregarded according to a modeling algorithm. In other words, the number of arrangements and rotation angles of the EUT in the TEM waveguide are decided according to the modeling algorithm.

Hereinafter, a system for measuring a radiation pattern and gain of the EUT in the TEM waveguide will be described with reference to FIG. 5.

As shown, the radiation pattern and gain measurement system includes TEM waveguide 40, a EUT 41, a coaxial cable 42, a power receiver 43 and a personal computer unit 44.

The EUT 41 is located in the TEM waveguide, and the output port of the TEM waveguide is connected to the coaxial cable 42. The EUT is a radiator which can be modeled as an equivalent dipole, because the EUT is an electronically small.

The TEM waveguide is a measurement system having an outer conductor which electromagnetically shields from the outside and has a shielding window so as to monitor the EUT in the outside, and an inner conductor which is a septum. When the EUT 41 is operated in normal condition after locating the EUT 41 in the TEM waveguide 40, power radiating from the EUT 41 is received the power receiver 43 through the output port of the TEM waveguide.

The coaxial cable 42 is connected to the output port of the TEM waveguide and the power receiver 43, and the power receiver 43 measures the power radiated from the EUT 41 through the coaxial cable 42.

The power receiver 43 informs the personal computer unit 44 of the measured power levels. The personal computer unit 44 estimates a radiation pattern of the EUT 41 modeled as the equivalent dipole in a free space based on the measured power.

Estimation of electromagnetic interference (EMI) using the TEM waveguide is performed by calculating the maximum radiation value from an EUT with the waveguide output powers and reporting the value as an EMI result. The maximum radiation value is obtained by simulating the radiation field under assumption that the modeled EUT is located on the ground plane such as the OATS or semi-anechic chamber.

A common feature in the measurements of the EMI and the ERP is to find the maximum electric field in a standard test field. The measurement of the EMI is terminated by compensating the maximum power regarding losses in the receiving antenna and the cable. The measurement of the ERP performs additional steps of obtaining a gain relative to a half-wave dipole antenna and multiplying the power transmitted to the antenna of the EUT by the gain.

Figure 6:
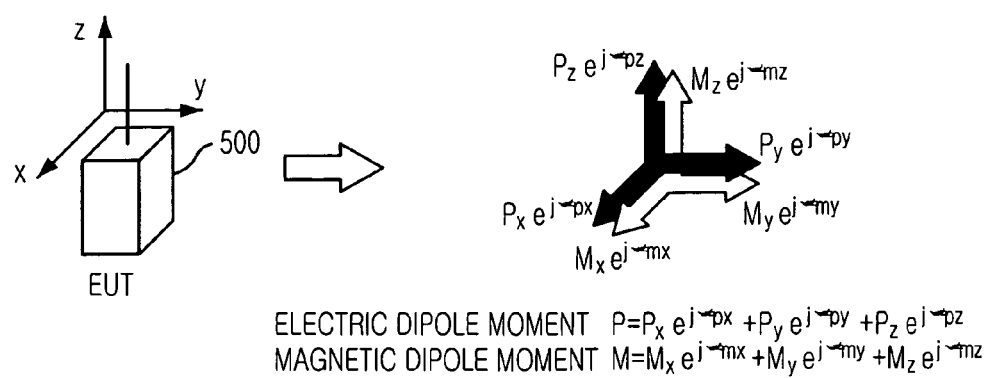
FIG. 6 is a diagram depicting modeling electronic/magnetic dipole of EUT to which the present invention is applied.

FIG. 6 is a diagram depicting modeling electronic/magnetic dipole of EUT to which the present invention is applied.

In the present invention, a small radiator (EUT) 500 is located in the TEM waveguide, the power of the output port of the TEM waveguide is measured by changing the arrangement of the EUT eighteen times, and the gain and the radiation pattern of the EUT are measured by electromagnetically modeling the EUT based on the eighteen power values.

As shown, the EUT is modeled as an electric dipole having three elements orthogonal to each other and a magnetic dipole having three elements orthogonal to each other. In order for accurate modeling, it is considered relative phase difference among x, y and z elements of the dipole moment.

The detection of the maximum radiation, which includes measurement of the radiation field in the test chamber, e.g., the anechoic chamber, is performed by assuming a radiation field from the modeled electronic dipole and the magnetic dipole.

Figure 7:
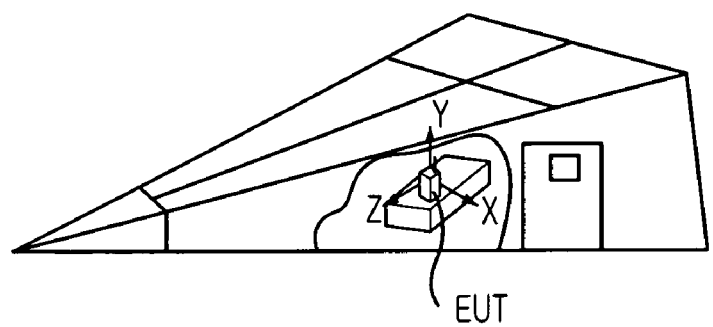
FIGS. 7 and 8 are diagrams depicting coordinate system of the TEM waveguide and the EUT to which the present invention is applied.
Figure 8:
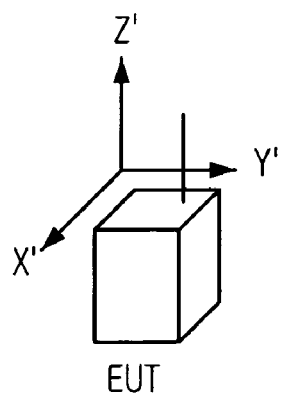

FIGS. 7 and 8 are diagrams depicting coordinate system of the TEM waveguide and the EUT to which the present invention is applied.

As shown, a reference coordinate system of the TEM waveguide is X, Y, Z (FIG. 7), and a reference coordinate system of the EUT is X', Y', Z' (FIG. 8), which are in general. The power of the output ports of the TEM waveguide is related to the reference coordinate system of the TEM waveguide (FIG. 7), and the radiation pattern of the radiator is related to the reference coordinate system of the EUT is X', Y', Z' (FIG. 8).

Figure 9:
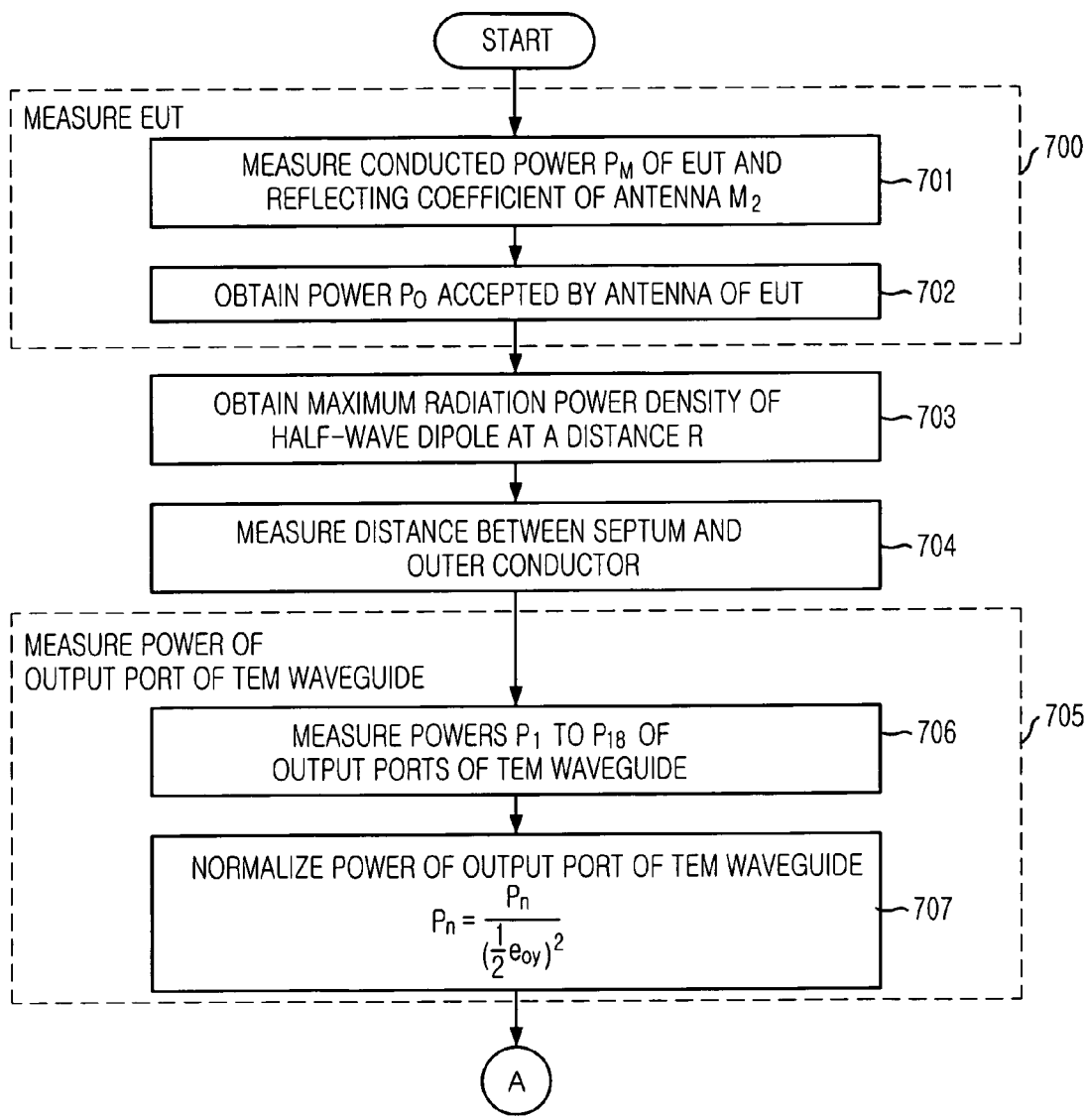
FIGS. 9 and 10 are flow charts illustrating a method for measuring a radiation pattern and gain of a radiator based on TEM waveguide in accordance with the present invention.
Figure 10:
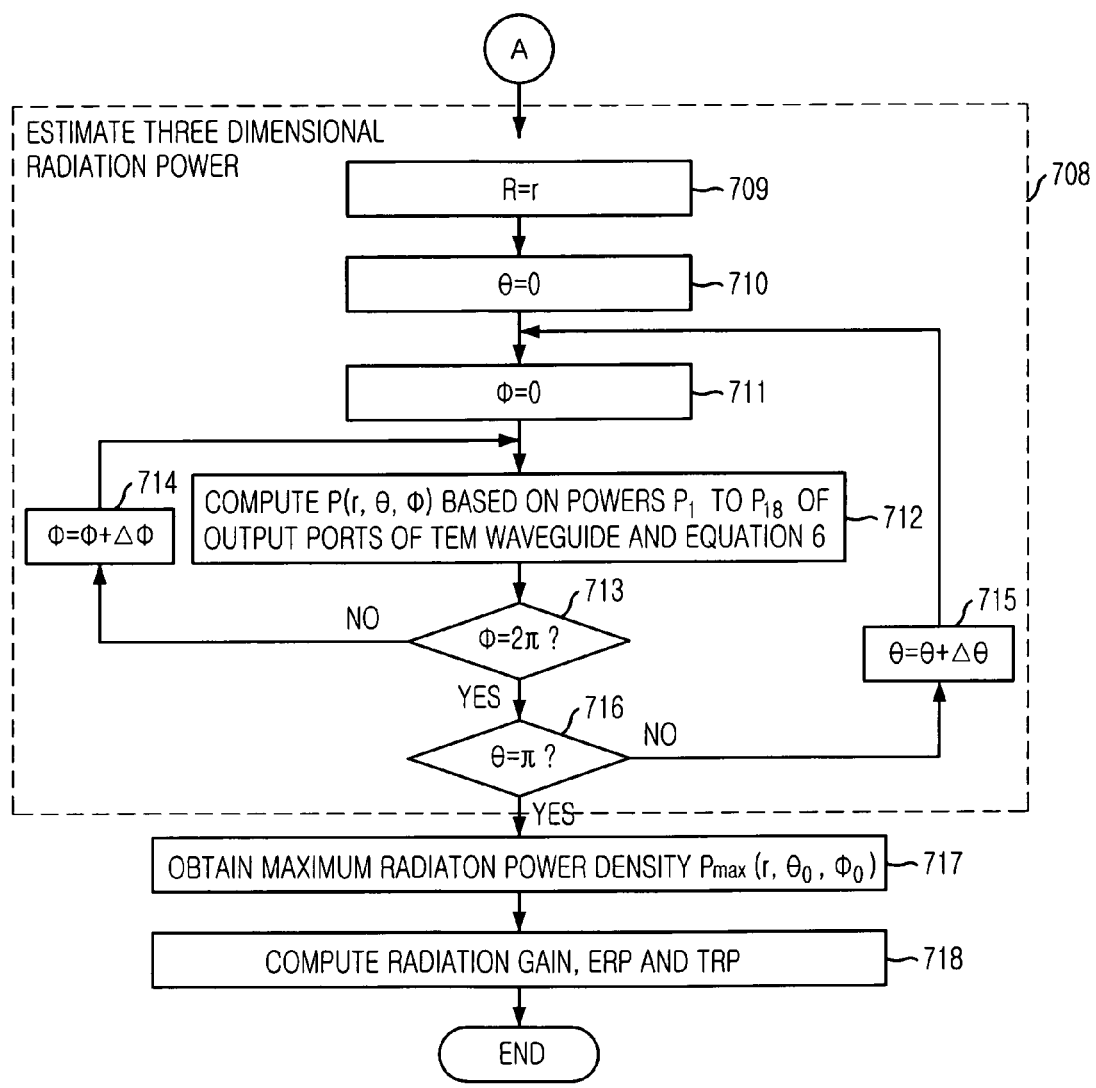

FIGS. 9 and 10 are flow charts illustrating a method for measuring a radiation pattern and gain of a radiator based on TEM waveguide in accordance with the present invention.

In this embodiment, a gain, an ERP and a TRP of the radiator are measured in the TEM waveguide without a receiving antenna.

At step S701, a conducted power $P_M$ transmitted to the EUT and a reflection coefficient $M_2$ of the antenna of the EUT are measured.

At step S702, a power $P_0$ accepted by the antenna of the EUT is obtained based on the conducted power $P_M$ and the reflection coefficient $M_2$ by an equation 1 as:

$$P_0 = P_M \times (1 - M_2) \qquad \text{Eq. (1)}$$

At step S703, the maximum radiated power density ($P_D$) of a half-wave dipole to the equal power $P_0$ within a measuring distance R is calculated by an equation 2 as:

$$P_D = \frac{P_0 \cdot 1.64}{4\pi R^2} \qquad \text{Eq. (2)}$$

In Eq. (2), it is preferred to use a gain of the half-wavelength dipole, which is measured in the TEM waveguide in real, instead of the absolute gain, 1.64, of the half-wavelength dipole.

Figure 11:
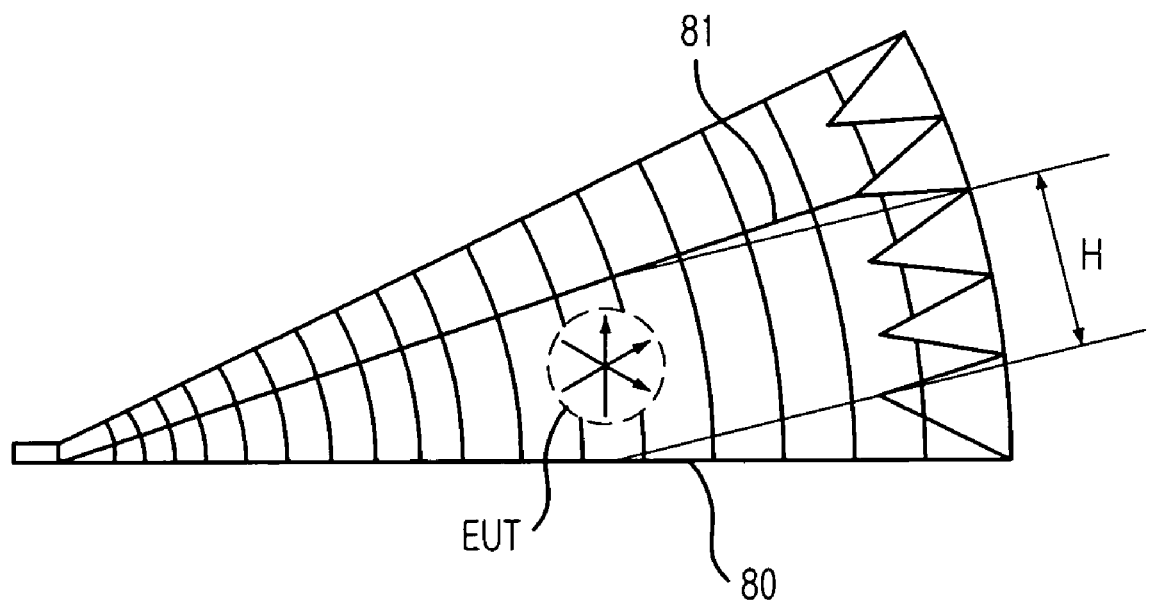
FIG. 11 is a diagram illustrating a cell height in the TEM waveguide.
Figure 12:
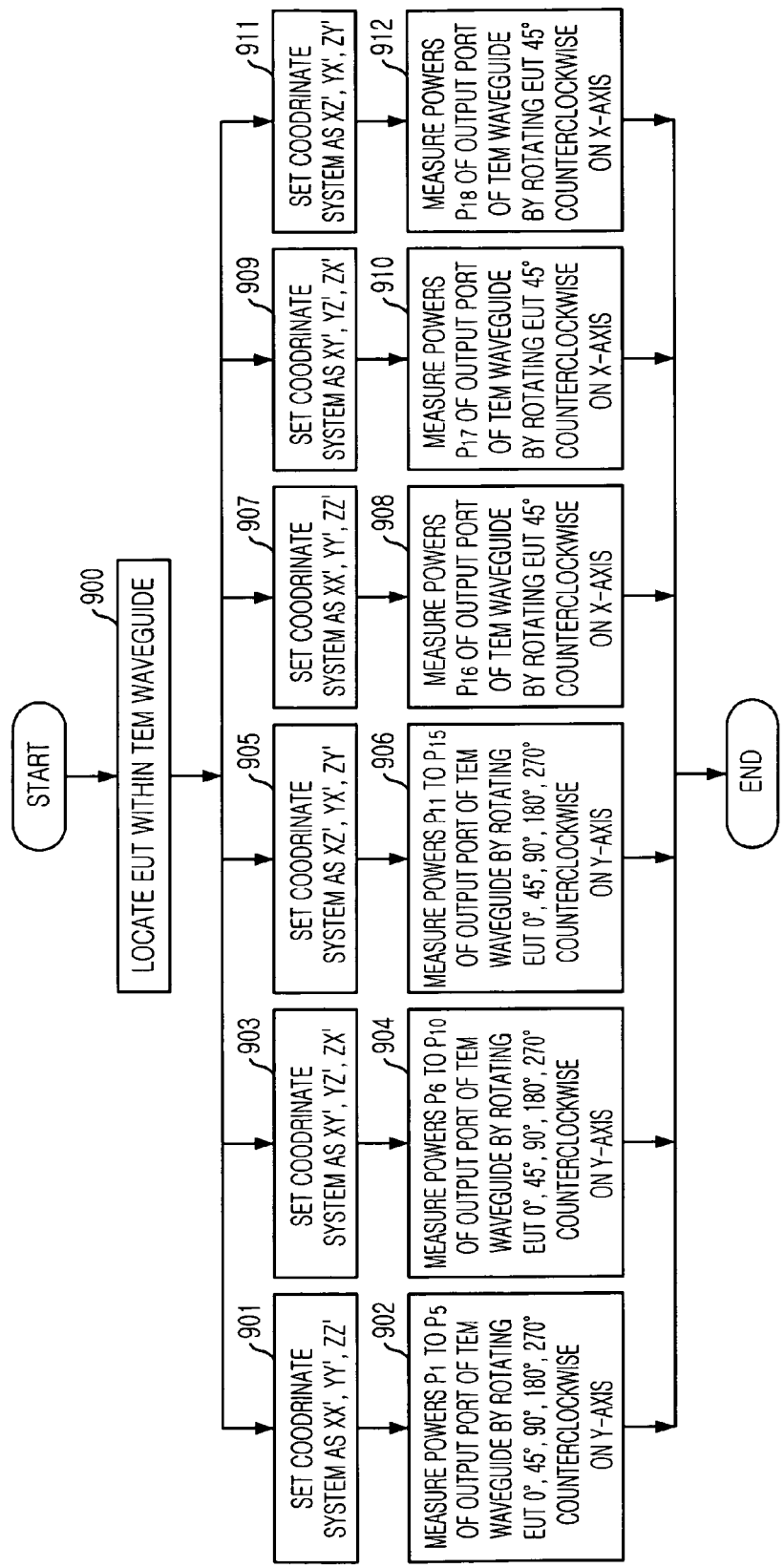
FIG. 12 is a flow chart illustrating a method for measuring powers $P_1 \sim P_{18}$ of the output port of the TEM waveguide for eighteen (18) arrangements of EUT in accordance with the present invention.

At step S704, a distance between the septum and the outer conductor is measured at a position of the EUT, the distance is referred to as "H" (See FIG. 11). Since an intensity of the electromagnetic field formed in the cell is changed based on H, H is necessary for normalizing the power of the output port of the TEM waveguide.

At step S706, powers $P_1$ to $P_{18}$ of the output port of the TEM waveguide are measured and stored. Herein, $P_1$ to $P_{18}$ are obtained by locating the EUT on a height H in the TEM waveguide. The frequency of the measured power is the same frequency as a target frequency of the ERP or TRP to be measured. The frequency can be a single frequency or a frequency having a bandwidth.

The powers of the output ports of the TEM waveguide is normalized by dividing the powers by $$\left(\frac{1}{2}e_{0y}\right)^2$$

when 1.0 W is applied to the TEM waveguide, which is expressed in Equation 3 as:

$$P_n = \frac{P_n}{\left(\frac{1}{2}e_{0y}\right)^2} \qquad \text{Eq. (3)}$$

$$e_{0y} = \frac{1}{H}\sqrt{P_{unit} \cdot Z_0} = \frac{1}{H}\sqrt{50}$$

wherein, $e_{0y}$ is a fundamental mode, i.e., an orthogonal element in an electrical field of the TEM mode when a unit power is applied to the TEM waveguide.

Step 705 including steps 706 and 707 is a procedure of measuring powers of the output ports of the TEM waveguide related to estimate the radiation field by measuring the EUT.

At step 708, the radiation power of the EUT in the free space is estimated based on the powers $P_1$ to $P_{18}$ by using a following Equation 6.

In order to estimate radiation power, the radiation field is scanned. Representative scan method includes a cylinderical scan and a spherical scan. Hereinafter, the sphere scan is described.

A radiation power density P(r, θ, Φ) of the EUT on a sphere having a radius r in free space is obtained based on the powers $P_1$ to $P_{18}$ of the output port of the TEM waveguide and an equation (6).

First, at step 709 and 710, let the radius of the sphere be R=r, and θ be 0[rad], at steps 712 to 714, the radiation power density P(r, θ, Φ) of the EUT on a virtual sphere in free space is measured by changing Φ from 0 to 2π[rad]. The radiation power density P(r, θ, Φ) is obtained by the powers $P_1$ to $P_{18}$ of the output port of the TEM waveguide into the Equation (6) and the spherical coordinate system. The radiation power density P(r, θ, Φ) represents a radiation power density P(r, θ, Φ) on a position in spherical coordinate system.

In other words, at step 714, θ and Φ are set by 0 [rad], the radiation power density is obtained, and then the radiation power density on (r, 0, ΔΦ) in spherical coordinate system. These procedures are repeated until Φ=2π[rad].

At step 715, θ is increased by ΔΦ, at steps 712 to 714, the radiation power density is obtained by changing Φ from 0 to 2π[rad]. These procedures are repeated until Φ=π[rad] at steps 711 to 716.

In other words, the sphere scan is procedures of obtaining a radiation power density P(r, θ, Φ) of the EUT on a sphere having a radius r in free space based on the powers $P_1$ to $P_{18}$ of the output port of the TEM waveguide and an equation (6).

The equation (6) is obtained based on following equations (4) and (5). In the cylinder scan or scanning for a certain area, if a position on which the radiation power density is to be obtained is converted to the sphere coordinate system, the equation (6) can be directly applied.

$$P(\theta, \phi) = \frac{1}{2} R_e((E \times H^\phi) \cdot \hat{a}_r)$$ Eq. (4)

$$= \frac{1}{2} R_e((E_\theta \hat{a}_\theta + E_\phi \hat{a}_\phi) \times (H_\theta \hat{a}_\theta + H_\phi \hat{a}_\phi)^*) \cdot \hat{a}_r)$$

$$= \frac{1}{2} R_e(H_\phi H_\phi^* \eta_0 + H_\theta H_\theta^* \eta_0) \cdot \hat{a}_r \cdot \hat{a}_r$$

$$= \frac{\eta}{2} R_e \left\{ \begin{matrix} \left[ -\frac{jk_0 e^{-jk_0 r}}{4\pi r} \left( N_\theta + \frac{L_\phi}{\eta_0} \right) \right] \left[ -\frac{jk_0 e^{-jk_0 r}}{4\pi r} \left( N_\theta + \frac{L_\phi}{\eta_0} \right) \right]^\phi \\ \left[ -\frac{jk_0 e^{-jk_0 r}}{4\pi r} \left( N_a - \frac{L_\theta}{\eta_0} \right) \right] \left[ -\frac{jk_0 e^{-jk_0 r}}{4\pi r} \left( N_\phi - \frac{L_\theta}{\eta_0} \right) \right]^\phi \end{matrix} \right\}$$

where $$N_\theta = \iint_S (P'_X \cos\theta\cos\phi + P'_Y \cos\theta\sin\phi - P'_Z \sin\theta) e^{+jkr'\cos\varphi} ds'$$

$$N_\phi = \iint_S (-P'_X \sin\phi + P'_Y \cos\phi) e^{+jkr'\cos\varphi} ds'$$

$$L_\theta = \iint_S (M'_x \cos\theta\cos\phi + M'_y \cos\theta\sin\phi - M'_z \sin\theta) e^{+jk_0 r'\cos\varphi} ds'$$

$$L_\phi = \iint_S (-M'_x \sin\phi + M'_y \cos\phi) e^{+jk_0 r'\cos\varphi} ds'$$

$$P(\theta, \phi) = \frac{15\pi}{r^2 \lambda^2} \begin{pmatrix} [P'^2_x + k_0^2 M'^2_x][\cos^2\theta\cos^2\phi + \sin^2\phi] + \\ [P'^2_y + k_0^2 M'^2_y][\cos^2\theta\sin^2\phi + \cos^2\phi] + \\ [P'^2_x + k_0^2 M'^2_x]\sin^2\theta - \\ 2\begin{bmatrix} P'_x P'_y \cos(\varphi_{px} - \varphi_{py}) + \\ k_0^2 M'_x M'_y \cos(\varphi_{mx} - \varphi_{my}) \end{bmatrix} \sin^2\theta \sin\phi\cos\phi - \\ 2\begin{bmatrix} P'_y P'_z \cos(\varphi_{py} - \varphi_{pz}) + \\ k_0^2 M'_y M'_z \cos(\varphi_{my} - \varphi_{mz}) \end{bmatrix} \sin\theta\cos\theta\sin\phi - \\ 2\begin{bmatrix} P'_z P'_x \cos(\varphi_{pz} - \varphi_{pz}) + \\ k_0^2 M'_z M'_x \cos(\varphi_{mz} - \varphi_{mx}) \end{bmatrix} \sin\theta\cos\theta\cos\phi + \\ 2k_0 \begin{bmatrix} P'_x M'_y \sin(\varphi_{px} - \varphi_{my}) - \\ P'_y M'_x \sin(\varphi_{py} - \varphi_{mx}) \end{bmatrix} \cos\theta + \\ 2k_0 \begin{bmatrix} P'_y M'_z \sin(\varphi_{py} - \varphi_{mz}) - \\ P'_{yx} M'_y \sin(\varphi_{pz} - \varphi_{my}) \end{bmatrix} \sin\theta\cos\phi + \\ 2k_0 \begin{bmatrix} P'_z M'_x \sin(\varphi_{pz} - \varphi_{mx}) - \\ P'_x M'_z \sin(\varphi_{px} - \varphi_{mz}) \end{bmatrix} \sin\theta\sin\phi \end{pmatrix}$$

$$P(\theta, \phi) = \frac{15\pi}{r^2 \lambda^2} \begin{pmatrix} [A + k_0^2 D][\cos^2\theta\cos^2\phi + \sin^2\phi] + \\ [B + k_0^2 B][\cos^2\theta\sin^2\phi + \cos^2\phi] + \\ [C + k_0^2 F]\sin^2\theta - \\ 2[G + k_0^2 J]\sin^2\theta\sin\phi\cos\phi - \\ 2[H + k_0^2 K]\sin\theta\cos\theta\sin\phi - \\ 2[I + k_0^2 L]\sin\theta\cos\theta\cos\phi + \\ 2k_0[M - P]\cos\theta + 2k_0[N - Q]\sin\theta\cos\phi + \\ 2k_0[O - R]\sin\theta\sin\phi \end{pmatrix}$$ Eq. (5)

where

-continued $$A + k_0^2 D = \frac{1}{4}(P_1 + P_4 + P_{11} + P_{14} -$$ Eq. (6)
$$P_3 - P_5 + P_8 + P_{10} + P_{13} + P_{15} - P_6 - P_9)$$

$$B + k_0^2 B = \frac{1}{4}(P_1 + P_4 + P_6 + P_9 - P_8 - P_{10} +$$
$$P_3 + P_5 + P_{13} + P_{15} - P_{11} - P_{14})$$

$$C + k_0^2 F = \frac{1}{4}(P_6 + P_9 + P_{11} + P_{14} - P_{13} - P_{15} +$$
$$P_3 + P_5 + P_8 + P_{10} - P_1 - P_4)$$

$$G = P_{18} - \frac{(P_3 + P_5 + P_{11} + P_{14}) + \sqrt{2}(P_3 - P_5 + P_{11} - P_{14})}{4}$$

$$J = \frac{4P_7 - (P_6 + P_8 + P_9 + P_{10}) + \sqrt{2}(P_9 - P_6 + P_{10} - P_8)}{4k_0^2}$$

$$H = P_{16} - \frac{(P_1 + P_4 + P_8 + P_{10}) + \sqrt{2}(P_1 - P_4 + P_8 - P_{10})}{4}$$

$$K = \frac{4P_{12} - (P_{11} + P_{13} + P_{14} + P_{15}) + \sqrt{2}(P_{14} - P_{11} + P_{15} - P_{18})}{4k_0^2}$$

$$I = P_{17} - \frac{(P_6 + P_9 + P_{13} + P_{15}) + \sqrt{2}(P_6 - P_9 + P_{13} - P_{15})}{4}$$

$$L = \frac{4P_2 - (P_1 + P_3 + P_4 + P_5) + \sqrt{2}(P_4 - P_1 + P_5 - P_8)}{4k_0^2}$$

$$M = \frac{P_{15} - P_{13}}{4k_0^2}$$

$$P = \frac{P_4 - P_1}{4k_0^2}$$

$$N = \frac{P_5 - P_3}{4k_0^2}$$

$$Q = \frac{P_9 - P_6}{4k_0^2}$$

$$O = \frac{P_{10} - P_8}{4k_0^2}$$

$$R = \frac{P_{14} - P_{11}}{4k_0^2}$$

Eq. (5) represents a radiation power density on a spherical coordinates (r, θ, Φ) to the electric dipole moment P and the magnetic dipole moment M. Since the dipole moments P and M can be expressed by an equation related to the power of the output port of the TEM waveguide, and the radiation power density in a desired scan area can be obtained by putting the powers $P_1$ to $P_{18}$ of the output port of the TEM waveguide to the equation (6).

At step 717, it is obtained the maximum power density $P_{max}(r, \theta_0, (\phi_0)$ among the radiation power densities obtained at the steps 709 to 716.

Next, at step 718, a relative gain, a total radiation power (TRP) and an effective radiation power (ERP) are calculated based on following equations (7) and (8).

$$\text{relative gain } g = \frac{P_{max}}{P_D}$$ Eq. (7)

$$\text{relative gain } G [dBd] = 10 \text{Log}\left(\frac{P_{max}}{P_D}\right)$$

$$TRP = \int_0^{360°} \int_0^{180°} P(r, \theta, \phi) r^2 \sin\theta d\theta d\phi$$ Eq. (8)

Eq. (8) represents sphere integration to an electric density on a spherical having a radius r.

$$ERP = \frac{P_{max} \cdot 4\pi R^2}{1.64} \qquad \text{Eq. (9)}$$

In the equation (9), it is preferred that an absolute gain of the half-wave dipole antenna, 1.64, is replaced with a gain of the half-wave dipole antenna, wherein the gain is measured with the TEM waveguide.

FIG. 11 is a diagram illustrating a cell height in the TEM waveguide.

As shown, a distance between the septum 81 and the outer conductor is measured at a position of the EUT within the TEM waveguide, and the distance is referred to as a cell height H. According to the cell height H, an intensity of the electric field is varied.

In order to obtain more accurate powers of the output port of the TEM waveguide, the maximum length of a side of the EUT should be shorter than H/3 of the TEM waveguide.

FIGS. 9 and 10 are flow charts illustrating a method for measuring powers $P_1 \sim P_{18}$ of the output port of the TEM waveguide for eighteen (18) direction of EUT in accordance with the present invention.

It is simply described the method for measuring powers $P_1 \sim P_{18}$ of the output port of the TEM waveguide for eighteen (18) arrangements of EUT with reference to FIG. 9. Detailed method for measuring powers $P_1$-$P_{18}$ of the output port of the TEM waveguide is illustrated with reference to FIG. 11.

After locating the EUT within the TEM waveguide at step 900, a reference coordinate system (X, Y, Z) of the TEM waveguide is putted to a reference coordinate system (X, Y, Z) of the EUT, and the powers $P_1 \sim P_{18}$ of the output port of the TEM waveguide for eighteen (18) arrangements of the EUT are measured by rotating the EUT on X-axe or Y-axe at steps 901 to 912.

At step 901, in case of a coordinate system (XX', YY', ZZ'), the powers $P_1$ to $P_5$ of the output port of the TEM waveguide is measured after rotating the EUT counterclockwise by 0°, 45°90°, 180° and 270° on Y-axis. Wherein the position (XX', YY', ZZ') means the EUT coordinate axes X', Y' and Z' are putted to GTEM coordinate axes X, Y, Z, respectively.

At step 904, in case of a coordinate system (XY', YZ', ZX'), the powers $P_6$ to $P_{10}$ of the output port of the TEM waveguide is measured after rotating the EUT counterclockwise by 0°, 45°90°, 180° and 270° on Y-axis. Wherein the position (XY', YZ', ZX') means the EUT coordinate axes X', Y' and Z' are putted to GTEM coordinate axes Y, Z, X, respectively.

At step 906, in case of a coordinate system (XZ', YX', ZY'), the powers $P_{11}$ to $P_{15}$ of the output port of the TEM waveguide is measured after rotating the EUT counterclockwise by 0°, 45°, 90°, 180° and 270° on Y-axis. Wherein the position (XZ', YX', ZY') means the EUT coordinate axes X', Y' and Z' are putted to GTEM coordinate axes Z, X, Y, respectively.

At steps 907 and 908, in case of a coordinate system (XX', YY', ZZ'), the power $P_{16}$ of the output port of the TEM waveguide is measured after rotating the EUT counterclockwise by 45° on X-axis.

At steps 909 and 910, in case of a coordinate system (XY', YZ', ZX'), the power $P_{17}$ of the output port of the TEM waveguide is measured after rotating the EUT counterclockwise by 45° on X-axis.

At steps 911 and 912, in case of a coordinate system (XZ', YX', ZY'), the powers $P_{11}$ to $P_{15}$ of the output port of the TEM waveguide is measured after rotating the EUT counterclockwise by 45° on X-axis.

FIGS. 12 to 17 are diagrams illustrating a method for measuring powers $P_1 \sim P_{18}$ of the output port of the TEM waveguide for eighteen (18) arrangements of EUT in accordance with the present invention.

In general, after putting the reference coordinate system of the EUT to the reference coordinate system of the TEM waveguide, the measurement of the powers for eighteen arrangements of the EUT is performed. However, orders in the measurement of the powers for eighteen arrangements of the EUT can be changed.

Figure 13:
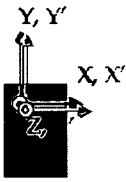
Figure 13:
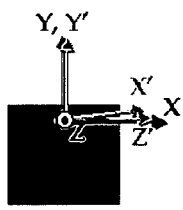
Figure 13:
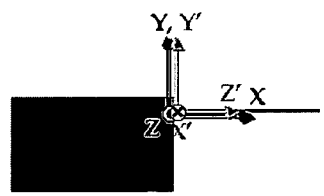
Figure 13:
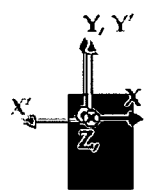
Figure 13:
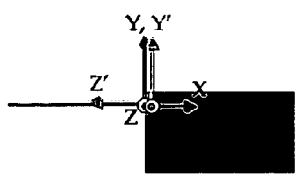

After putting the reference coordinate system (X', Y', Z') of the EUT to the reference coordinate system (X, Y, Z) of the TEM waveguide, the powers for arrangements 1 to 5 of the EUT are measured by rotating the EUT counterclockwise on Y-axis. (FIG. 13)

Arrangement 1: In case of a coordinate system (XX', YY', ZZ'), a power $P_1$ of the output port of the TEM waveguide is measured after rotating the EUT counterclockwise by 0° (i.e., no rotation) on Y-axis. Wherein the position (XX', YY', ZZ') means the EUT coordinate axes X', Y' and Z' are putted to GTEM coordinate axes X, Y, Z, respectively.

Arrangement 2: In case of the coordinate system (XX', YY', ZZ'), a power $P_2$ of the output port of the TEM waveguide is measured after rotating the EUT counterclockwise by 45° on Y-axis.

Arrangement 3: In case of the coordinate system (XX', YY', ZZ'), a power $P_3$ of the output port of the TEM waveguide is measured after rotating the EUT counterclockwise by 90° on Y-axis.

Arrangement 4: In case of the coordinate system (XX', YY', ZZ'), a power $P_4$ of the output port of the TEM waveguide is measured after rotating the EUT counterclockwise by 180° on Y-axis.

Arrangement 5: In case of the coordinate system (XX', YY', ZZ'), a power $P_5$ of the output port of the TEM waveguide is measured after rotating the EUT counterclockwise by 270° on Y-axis.

Figure 14:
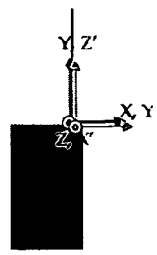
Figure 14:
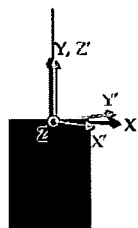
Figure 14:
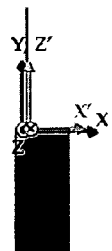
Figure 14:
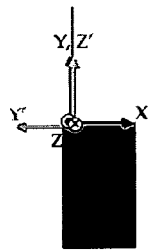
Figure 14:
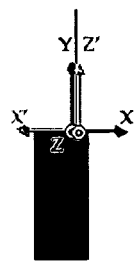

After measuring powers for the five arrangements of the EUT, powers $P_6$ to $P_{11}$ for next five arrangements of the EUT are measured. After putting the reference coordinate system (Y', Z', X') of the EUT to the reference coordinate system (X, Y, Z) of the TEM waveguide, the powers for arrangements 6 to 10 of the EUT are measured by rotating the EUT counterclockwise on Y-axis. (FIG. 14)

Arrangement 6: In case of the coordinate system (XY', YZ', ZX'), a power $P_6$ of the output port of the TEM waveguide is measured after rotating the EUT counterclockwise by 0° (i.e., no rotation) on Y-axis. Wherein the position (XX', YY', ZZ') means the EUT coordinate axes X', Y' and Z' are putted to GTEM coordinate axes Y, Z, X, respectively.

Arrangement 7: In case of the coordinate system (XY', YZ', ZX'), a power $P_7$ of the output port of the TEM waveguide is measured after rotating the EUT counterclockwise by 45° on Y-axis.

Arrangement 8: In case of the coordinate system (XY', YZ', ZX'), a power $P_8$ of the output port of the TEM waveguide is measured after rotating the EUT counterclockwise by 90° on Y-axis.

Arrangement 9: In case of the coordinate system (XY', YZ', ZX'), a power $P_9$ of the output port of the TEM waveguide is measured after rotating the EUT counterclockwise by 180° on Y-axis.

Arrangement 10: In case of the coordinate system (XY', YZ', ZX'), a power $P_9$ of the output port of the TEM waveguide is measured after rotating the EUT counterclockwise by 270° on Y-axis.

Figure 15:
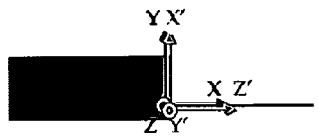
Figure 15:
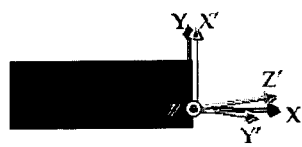
Figure 15:
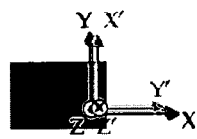
Figure 15:
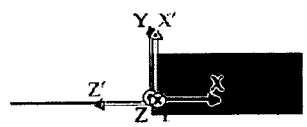
Figure 15:
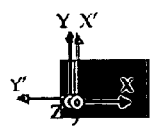
Figure 16:
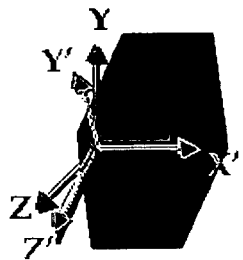

After putting the reference coordinate system (Z', X', Y') of the EUT to the reference coordinate system (X, Y, Z) of the TEM waveguide, the powers for arrangements 11 to 15 of the EUT are measured by rotating the EUT counterclockwise on Y-axis. (FIG. 15)

Arrangement 11: In case of the coordinate system (XZ', YX', ZY'), a power $P_{11}$ of the output port of the TEM waveguide is measured after rotating the EUT counterclockwise by 0° (i.e., no rotation) on Y-axis. Wherein the position (XX', YY', ZZ') means the EUT coordinate axes X', Y' and Z' are putted to GTEM coordinate axes Y, Z, X, respectively.

Arrangement 12: In case of the coordinate system (XZ', YX', ZY'), a power $P_{12}$ of the output port of the TEM waveguide is measured after rotating the EUT counterclockwise by 45° on Y-axis.

Arrangement 13: In case of the coordinate system (XZ', YX', ZY'), a power $P_{13}$ of the output port of the TEM waveguide is measured after rotating the EUT counterclockwise by 90° on Y-axis.

Arrangement 14: In case of the coordinate system (XZ', YX', ZY'), a power $P_{14}$ of the output port of the TEM waveguide is measured after rotating the EUT counterclockwise by 180° on Y-axis.

Arrangement 15: In case of the coordinate system (XZ', YX', ZY'), a power $P_{15}$ of the output port of the TEM waveguide is measured after rotating the EUT counterclockwise by 270° on Y-axis.

Arrangements 16 to 18 are implemented by rotating the EUT on X-axis, which will be hereinafter.

Figure 17:
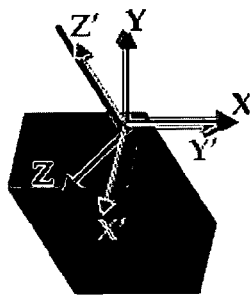

Arrangement 16: In case of the coordinate system (XX', YY', ZZ'), a power $P_{16}$ of the output port of the TEM waveguide is measured after rotating the EUT counterclockwise by 45° on X-axis. (FIG. 16) Arrangement 17: In case of the coordinate system (XY', YZ', ZX'), a power $P_{17}$ Of the output port of the TEM waveguide is measured after rotating the EUT counterclockwise by 45° on X-axis. (FIG. 17)

Figure 18:
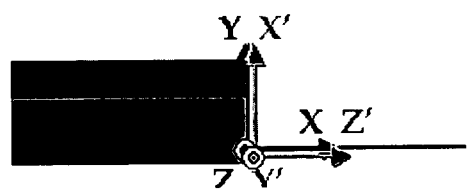

Arrangement 18: In case of the coordinate system (XZ', YX', ZY'), a power $P_{18}$ of the output port of the TEM waveguide is measured after rotating the EUT counterclockwise by 45° on X-axis. (FIG. 18)

The measured powers $P_1$ to $P_{18}$ of output ports of the TEM waveguide are used to estimate radiation power in free space. (FIGS. 9 and 10)

When estimating radiation performance of the transmitter, the conventional measuring method requires a test site, e.g., the OATS or the anechoic chamber, the receiver, the receiving antenna, the antenna master, a controller for mechanically moving the antenna. However, the measuring method in accordance with the present invention has less measurement error and reduces time and cost to measure the power.

By changing arrangements of the EUT within the TEM waveguide, the powers of the output port of the TEM waveguide are measured, and radiation patterns of the EUT can be obtained based on the minimum arrangements rapidly and accurately.

While the present invention has been described with respect to certain preferred embodiments, it will be apparent to those skilled in the art that various changes and modifications may be made without departing from the scope of the invention as defined in the following claims.

What is claimed is:

1. A method for measuring a radiation pattern and a gain of a radiator, comprising the steps of:
   a) measuring powers of output port of a transverse electric and magnetic (TEM) waveguide by changing arrangements of the radiator located within the TEM waveguide; and
   b) estimating a radiation power density of the radiator in free space, wherein the radiator is modeled as a dipole moment based on the powers of the output port of the TEM waveguide.

2. The method as recited in claim 1, further comprising the steps of:
   c) measuring a power $P_0$ received by an antenna of the radiator based on a conducted power accepted by the radiator and a reflecting coefficient of an antenna of the radiator, and obtaining a maximum radiation power density $P_D$ of a half-wave dipole antenna due to the power $P_0$ at a predetermined distance;
   d) obtaining the maximum radiation power density $P_{max}$ among the estimated radiation power densities;
   e) obtaining a radiation gain of the radiator based on the maximum radiation power density $P_{max}$ obtained in the step d) and the maximum radiation power density $P_D$ obtained in the step d); and
   f) obtaining an effective radiation power based on the maximum radiation power density $P_{max}$,
   wherein the maximum radiation power density $P_D$ of a half-wave dipole antenna due to the power $P_0$ at a predetermined distance is obtained by an equation as:

$$P_D = \frac{P_O \cdot \left(\begin{array}{c} \text{gain of half} - \\ \text{wave dipole antenna measured in } TEM \text{ waveguide} \end{array}\right)}{4\pi R^2}.$$

3. The method as recited in claim 2, further comprising the step of: computing a total radiation power (TRP) based on the estimated radiation power density.

4. The method as recited in claim 1, wherein said step a) includes the step of:
   a1) putting the EUT coordinate axes X', Y' and Z' to GTEM coordinate axes X, Y, Z, respectively, to thereby make a coordinate system (XX', YY', ZZ'), and measuring powers $P_1$ to $P_5$ of the output port of the TEM waveguide by rotating the EUT counterclockwise by 0°, 45°, 90°, 180° and 270° on Y-axis;
   a2) putting the EUT coordinate axes X', Y' and Z' to GTEM coordinate axes Y, Z, X, respectively, to thereby make a coordinate system (XY', YZ', ZX'), and measuring powers $P_6$ to $P_{10}$ of the output port of the TEM waveguide by rotating the EUT counterclockwise by 0°, 45°, 90°, 180° and 270° on Y-axis;
   a3) putting the EUT coordinate axes X', Y' and Z' to GTEM coordinate axes Z, X, Y, respectively, to thereby make a coordinate system (XZ', YX', ZY'), and measuring powers $P_{11}$ to $P_{15}$ of the output port of the TEM waveguide by rotating the EUT counterclockwise by 0°, 45°, 90°, 180° and 270° on Y-axis;
   a4) putting the EUT coordinate axes X', Y' and Z' to GTEM coordinate axes X, Y, Z, respectively, to thereby make a coordinate system (XX', YY', ZZ'), measuring power $P_{16}$ of the output port of the TEM waveguide by rotating the EUT counterclockwise by 45° on X-axis;
   a5) putting the EUT coordinate axes X', Y' and Z' to GTEM coordinate axes Y, Z, X, respectively, to thereby make a coordinate system (XY', YZ', ZX'), and measuring power $P_{17}$ of the output port of the TEM waveguide is measured after rotating the EUT counterclockwise by 45° on X-axis; and a6) putting the EUT coordinate axes X', Y' and Z' to GTEM coordinate axes Z, X, Y, respectively, to thereby make a coordinate system (XZ', YX', ZY'), and powers $P_{18}$ of the output port of the TEM waveguide by rotating the EUT counterclockwise by 45° on X-axis.

5. The method as recited in claim 4, wherein the radiation power density in free space is estimated based on the powers of the output port of the TEM waveguide by using an equation expressed as:

$$P(\theta,\phi) = \frac{15\pi}{r^2\lambda^2} \begin{pmatrix} [A + k_0^2 D][\cos^2\theta\cos^2\phi + \sin^2\phi] + \\ [B + k_0^2 B][\cos^2\theta\sin^2\phi + \cos^2\phi] + \\ [C + k_0^2 F]\sin^2\theta - \\ 2[G + k_0^2 J]\sin^2\theta\sin\phi\cos\phi - \\ 2[H + k_0^2 K]\sin\theta\cos\theta\sin\phi - \\ 2[I + k_0^2 L]\sin\theta\cos\theta\cos\phi + \\ 2k_0[M - P]\cos\theta + 2k_0[N - Q]\sin\theta\cos\phi + \\ 2k_0[O - R]\sin\theta\sin\phi \end{pmatrix} \text{ where}$$

$$A + k_0^2 D = \frac{1}{4}(P_1 + P_4 + P_{11} + P_{14} - P_3 - P_5 + P_8 + P_{10} + P_{13} + P_{15} - P_6 - P_9)$$

$$B + k_0^2 B = \frac{1}{4}(P_1 + P_4 + P_6 + P_9 - P_8 - P_{10} + P_3 + P_5 + P_{13} + P_{15} - P_{11} - P_{14})$$

$$C + k_0^2 F = \frac{1}{4}(P_6 + P_9 + P_{11} + P_{14} - P_{13} - P_{15} + P_3 + P_5 + P_8 + P_{10} - P_1 - P_4)$$

$$G = P_{18} - \frac{(P_3 + P_5 + P_{11} + P_{14}) + \sqrt{2}(P_3 - P_5 + P_{11} - P_{14})}{4}$$

$$J = \frac{4P_7 - (P_6 + P_8 + P_9 + P_{10}) + \sqrt{2}(P_9 - P_6 + P_{10} - P_8)}{4k_0^2}$$

$$H = P_{16} - \frac{(P_1 + P_4 + P_8 + P_{10}) + \sqrt{2}(P_1 - P_4 + P_8 - P_{10})}{4}$$

$$K = \frac{4P_{12} - (P_{11} + P_{13} + P_{14} + P_{15}) + \sqrt{2}(P_{14} - P_{11} + P_{15} - P_{18})}{4k_0^2}$$

$$I = P_{17} - \frac{(P_6 + P_9 + P_{13} + P_{15}) + \sqrt{2}(P_6 - P_9 + P_{13} - P_{15})}{4}$$

$$L = \frac{4P_2 - (P_1 + P_3 + P_4 + P_5) + \sqrt{2}(P_4 - P_1 + P_5 - P_8)}{4k_0^2}$$

-continued $$M = \frac{P_{15} - P_{13}}{4k_0^2}$$

$$P = \frac{P_4 - P_1}{4k_0^2}$$

$$N = \frac{P_5 - P_3}{4k_0^2}$$

$$Q = \frac{P_9 - P_6}{4k_0^2}$$

$$O = \frac{P_{10} - P_8}{4k_0^2}$$

$$R = \frac{P_{14} - P_{11}}{4k_0^2}.$$

6. The method as recited in claim 4, wherein the gain of the radiator is obtained by dividing the maximum radiation power density $P_{max}$ by the radiation power density $P_D$.

7. The method as recited in claim 4, wherein the effective radiation power (ERP) is obtained by multiplying the maximum radiation power density $P_{max}$ by surface area of a sphere having a predetermined radius to generate a multiplied value, and dividing the multiplied value by a gain of the half-wave dipole antenna wherein the gain is measured in the TEM waveguide, which is expressed by an equation as:

$$ERP = \frac{P_{max} \cdot 4\pi R^2}{\text{gain of half} - \text{wave antenna measured in } TEM \text{ waveguide}}.$$

8. The method as recited in claim 4, wherein the gain of half-wave antenna measured in TEM waveguide is about 1.64.

9. The method as recited in claim 8, wherein the TRP is obtained by integrating on the sphere having a predetermined radius for the radiation power density estimated in the step b), which is expressed by an equation as:

$$TRP = \int_0^{360°} \int_0^{180°} P(r, \theta, \phi) r^2 \sin\theta d\theta d\phi.$$

* * * * *